(12) United States Patent
Yamazaki (10) Patent No.: US 12,358,158 B2
(45) Date of Patent: *Jul. 15, 2025

(54) ROBOT CONTROLLER AND ROBOT SYSTEM

(71) Applicant: SEIKO EPSON CORPORATION, Tokyo (JP)

(72) Inventor: Takema Yamazaki, Fujimi (JP)

(73) Assignee: SEIKO EPSON CORPORATION (JP)

( * ) Notice: Subject to any disclaimer, the term of this patent is extended or adjusted under 35 U.S.C. 154(b) by 317 days.

This patent is subject to a terminal disclaimer.

(21) Appl. No.: 18/102,962

(22) Filed: Jan. 30, 2023

(65) Prior Publication Data
US 2023/0278233 A1    Sep. 7, 2023

(30) Foreign Application Priority Data

Jan. 31, 2022 (JP) ................................ 2022-013747

(51) Int. Cl.
*B25J 19/00* (2006.01)
*B25J 13/06* (2006.01)
*H05K 7/20* (2006.01)

(52) U.S. Cl.
CPC ........... *B25J 13/06* (2013.01); *B25J 19/0025* (2013.01); *B25J 19/0054* (2013.01); *H05K 7/20145* (2013.01)

(58) Field of Classification Search
CPC .................................................. B25J 19/0054
See application file for complete search history.

(56) References Cited

U.S. PATENT DOCUMENTS

| | | | | |
|---|---|---|---|---|
| 5,424,915 A * | 6/1995 | Katooka | ............ | H05K 7/20909 361/695 |
| 6,704,196 B1 * | 3/2004 | Rodriguez | ......... | H05K 7/20736 165/104.33 |
| 7,769,489 B2 * | 8/2010 | Teranaka | ............ | H05K 7/1464 318/705 |
| 8,599,555 B2 * | 12/2013 | Teranaka | ............... | G05B 19/18 361/695 |
| 9,894,813 B2 * | 2/2018 | Souda | ...................... | H05K 7/14 |
| 10,178,814 B2 * | 1/2019 | Falk | ...................... | H02M 7/003 |

(Continued)

FOREIGN PATENT DOCUMENTS

CN    107079605 B    8/2019
DE    202016005868 U1 * 12/2016 .......... B25J 19/0054

(Continued)

*Primary Examiner* — Robert J Hoffberg
(74) *Attorney, Agent, or Firm* — Harness, Dickey & Pierce, P.L.C.

(57) ABSTRACT

A robot controller includes a case having an intake port and an exhaust port and a flow channel connecting the intake port and the exhaust port, in which a gas supplied from the intake port flows toward the exhaust port, and a circuit board converting one of an alternating current and a direct current into the other, wherein the flow channel has a first region in which the circuit board is placed, a second region located downstream of the first region, a partition wall partitioning the first region and the second region, and a communication hole formed in the partition wall and communicating between the first region and the second region, and an opening area of the communication hole is smaller than an opening area of the intake port.

7 Claims, 10 Drawing Sheets

(56) References Cited

U.S. PATENT DOCUMENTS

| | | | |
|---|---|---|---|
| 10,342,144 B1 * | 7/2019 | Chiu | H05K 7/20136 |
| 10,602,611 B2 * | 3/2020 | Teranaka | H05K 7/1467 |
| 10,682,773 B2 * | 6/2020 | Wagner | H05K 7/20918 |
| 10,940,595 B2 * | 3/2021 | Niu | B25J 19/0054 |
| 11,161,257 B2 * | 11/2021 | Goto | B25J 19/0025 |
| 11,382,236 B2 * | 7/2022 | Tagashira | H02B 1/28 |
| 11,458,643 B2 * | 10/2022 | Tagashira | B25J 19/0054 |
| 2017/0238445 A1 | 8/2017 | Falk et al. | |
| 2020/0016775 A1 | 1/2020 | Tagashira | |
| 2020/0406481 A1 | 12/2020 | Goto | |
| 2023/0191631 A1 * | 6/2023 | Yamazaki | B25J 19/0054 700/245 |
| 2023/0241762 A1 * | 8/2023 | Teranaka | H05K 7/20136 700/245 |
| 2023/0241766 A1 | 8/2023 | Yamazaki | |
| 2023/0241784 A1 * | 8/2023 | Yamazaki | H02P 5/74 700/245 |
| 2023/0278233 A1 | 9/2023 | Yamazaki | |
| 2023/0405846 A1 * | 12/2023 | Takagi | H05K 7/20209 |

FOREIGN PATENT DOCUMENTS

| | | | | |
|---|---|---|---|---|
| JP | S60-033744 A | | 2/1985 | |
| JP | H06206182 A | * | 7/1994 | |
| JP | 2002154083 A | * | 5/2002 | B25J 19/0054 |
| JP | 2012-099784 A | | 5/2012 | |
| JP | 2015-136780 A | | 7/2015 | |
| JP | 5810584 B2 | * | 11/2015 | |
| JP | 2016112629 A | * | 6/2016 | B25J 9/161 |
| JP | 2016112630 A | * | 6/2016 | B25J 9/161 |
| JP | 2018-140453 A | | 9/2018 | |
| JP | 2019-110220 A | | 7/2019 | |
| WO | 2018-155693 A1 | | 8/2018 | |

* cited by examiner

ROBOT CONTROLLER AND ROBOT SYSTEM

The present application is based on, and claims priority from JP Application Serial Number 2022-013747, filed Jan. 31, 2022, the disclosure of which is hereby incorporated by reference herein in its entirety.

BACKGROUND

1. Technical Field

The present disclosure relates to a robot controller and a robot system.

2. Related Art

For example, a robot controller disclosed in JP-A-2015-136780 has a case main body, a power supply board, a power circuit board, and a regenerative resistor held in the case main body, and a fan placed in the case main body.

However, in the robot controller, the power supply board, the power circuit board, and the regenerative resistor are only placed side by side in the same space without partitions of walls or the like, and it is difficult to cool the units under the respective suitable conditions.

SUMMARY

A robot controller according to an aspect of the present disclosure includes a case having an intake port and an exhaust port and a flow channel connecting the intake port and the exhaust port, in which a gas supplied from the intake port flows toward the exhaust port, and a circuit board converting one of an alternating current and a direct current into the other, wherein the flow channel has a first region in which the circuit board is placed, a second region located downstream of the first region, a partition wall partitioning the first region and the second region, and a communication hole formed in the partition wall and communicating between the first region and the second region, and an opening area of the communication hole is smaller than an opening area of the intake port.

A robot system according to an aspect of the present disclosure includes a robot having a motor, and a robot controller coupled to the robot and controlling driving of the motor, wherein the robot controller includes a case having an intake port and an exhaust port and a flow channel connecting the intake port and the exhaust port, in which a gas supplied from the intake port flows toward the exhaust port, and a circuit board converting one of an alternating current and a direct current into the other, the flow channel has a first region in which the circuit board is placed, a second region located downstream of the first region, a partition wall partitioning the first region and the second region, and a communication hole formed in the partition wall and communicating between the first region and the second region, and an opening area of the communication hole is smaller than an opening area of the intake port.

DESCRIPTION OF EXEMPLARY EMBODIMENTS

As below, a robot controller and a robot system according to the present disclosure will be explained in detail based on preferred embodiments shown in the accompanying drawings.

First Embodiment

Figure 1:
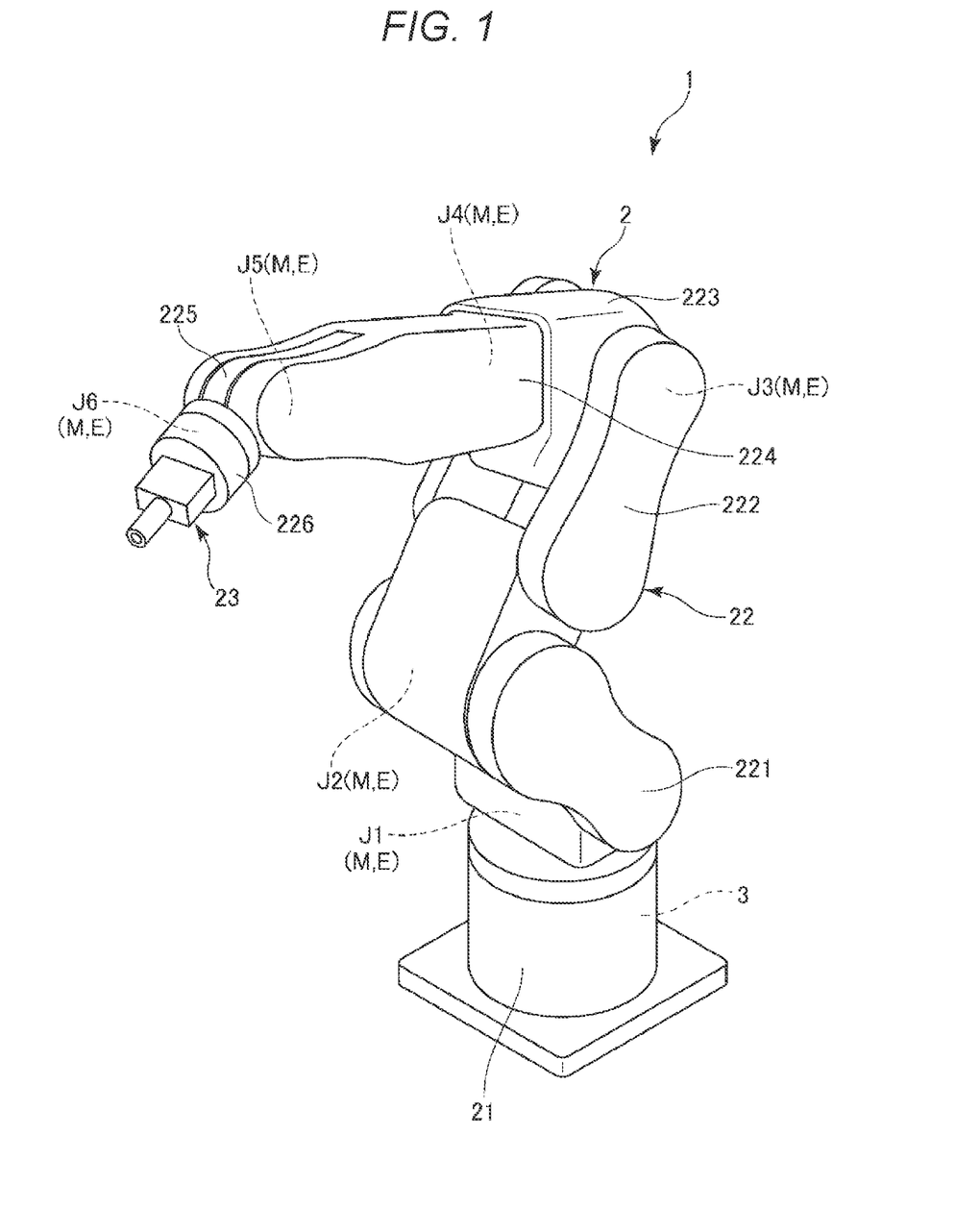
FIG. 1 is an overall configuration diagram of a robot system according to a first embodiment.
Figure 2:
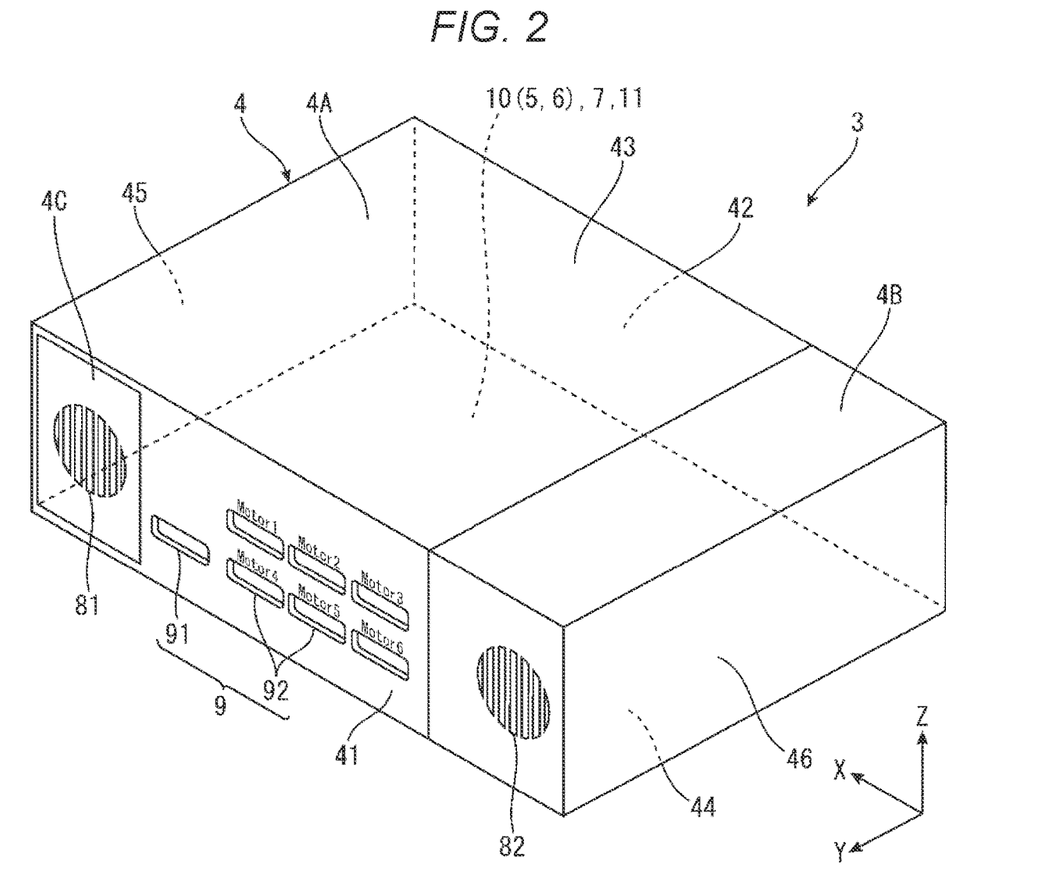
FIG. 2 is a perspective view showing a robot controller.
Figure 3:
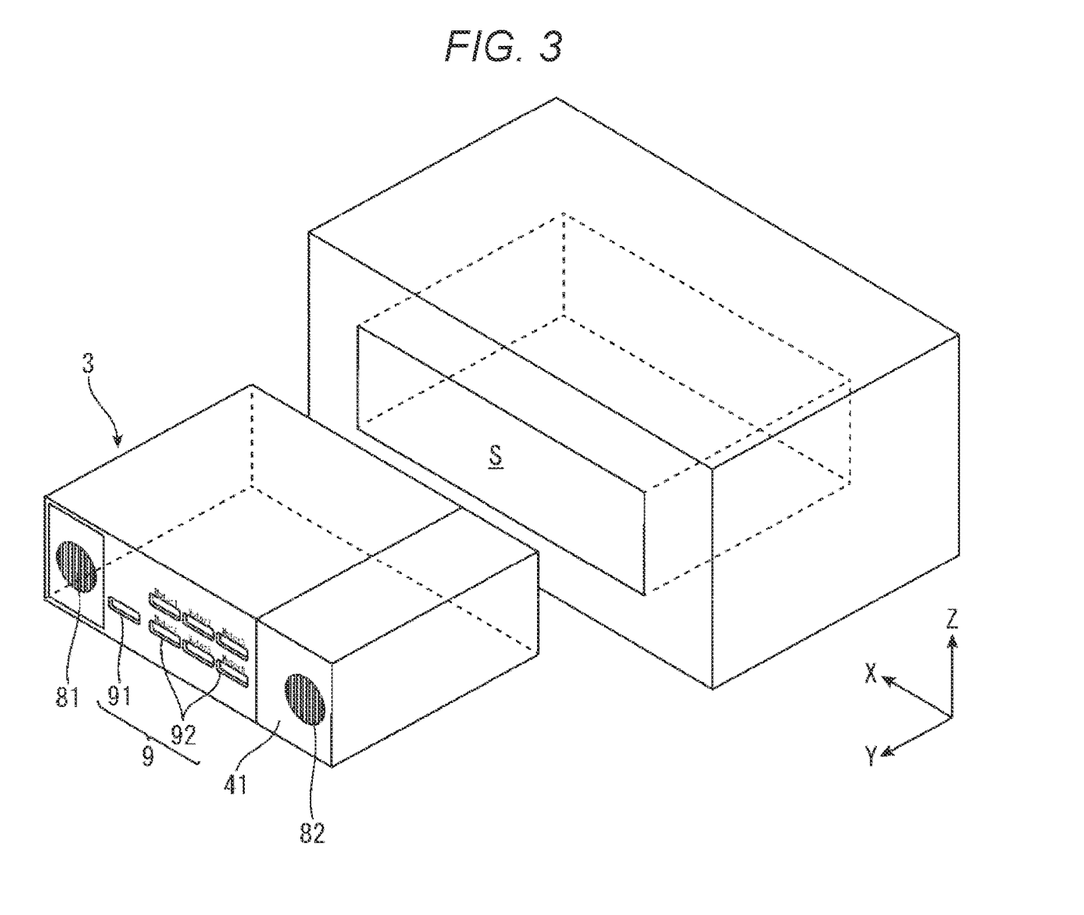
FIG. 3 is a perspective view showing an example of installation of the robot controller.
Figure 4:
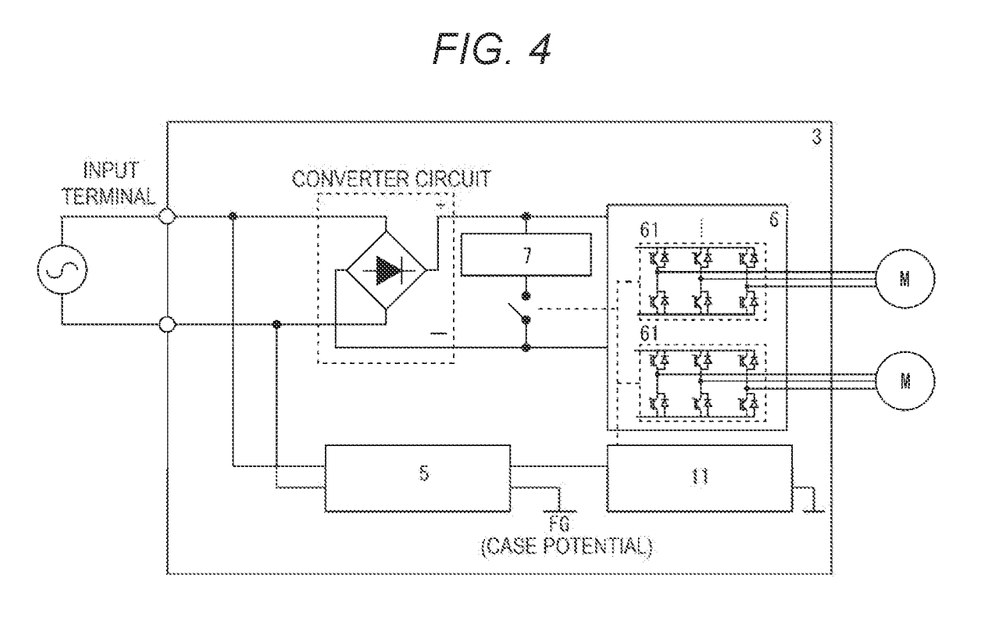
FIG. 4 is a block diagram of the robot system.
Figure 5:
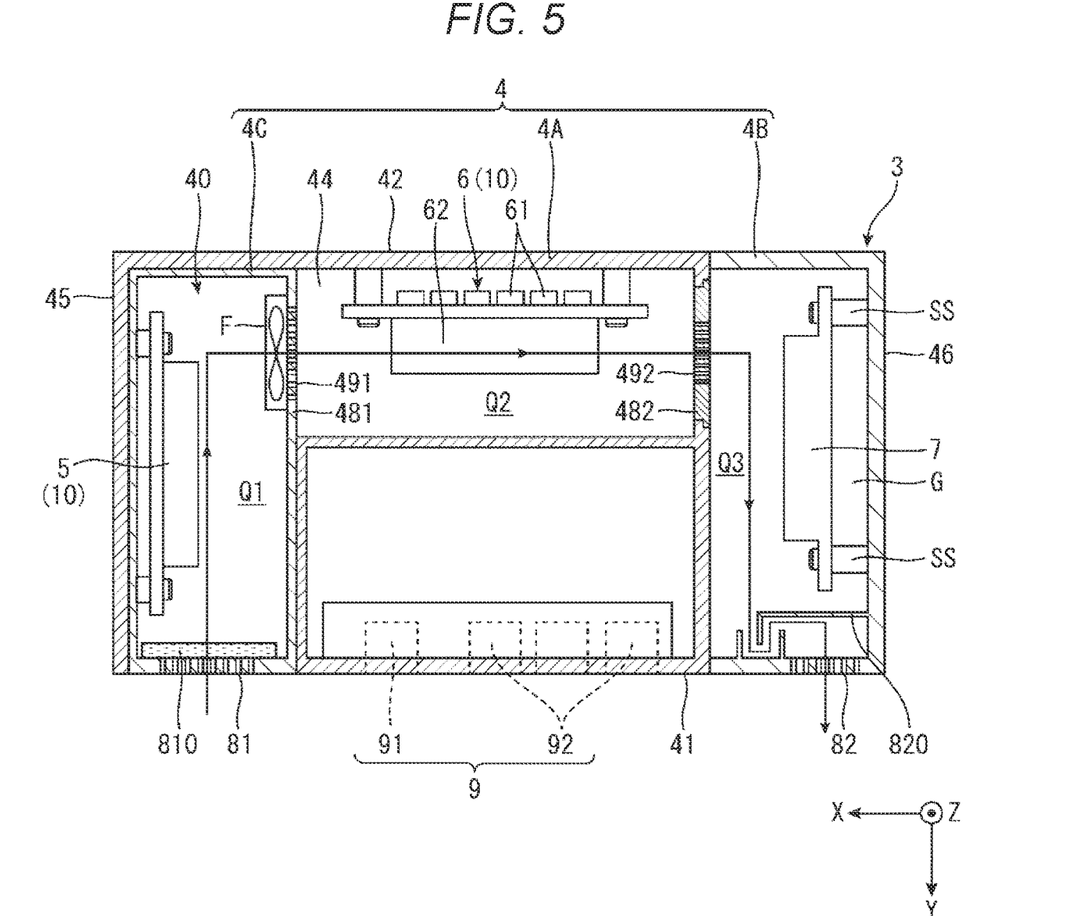
FIG. 5 is a sectional view showing an interior of the robot controller.
Figure 6:
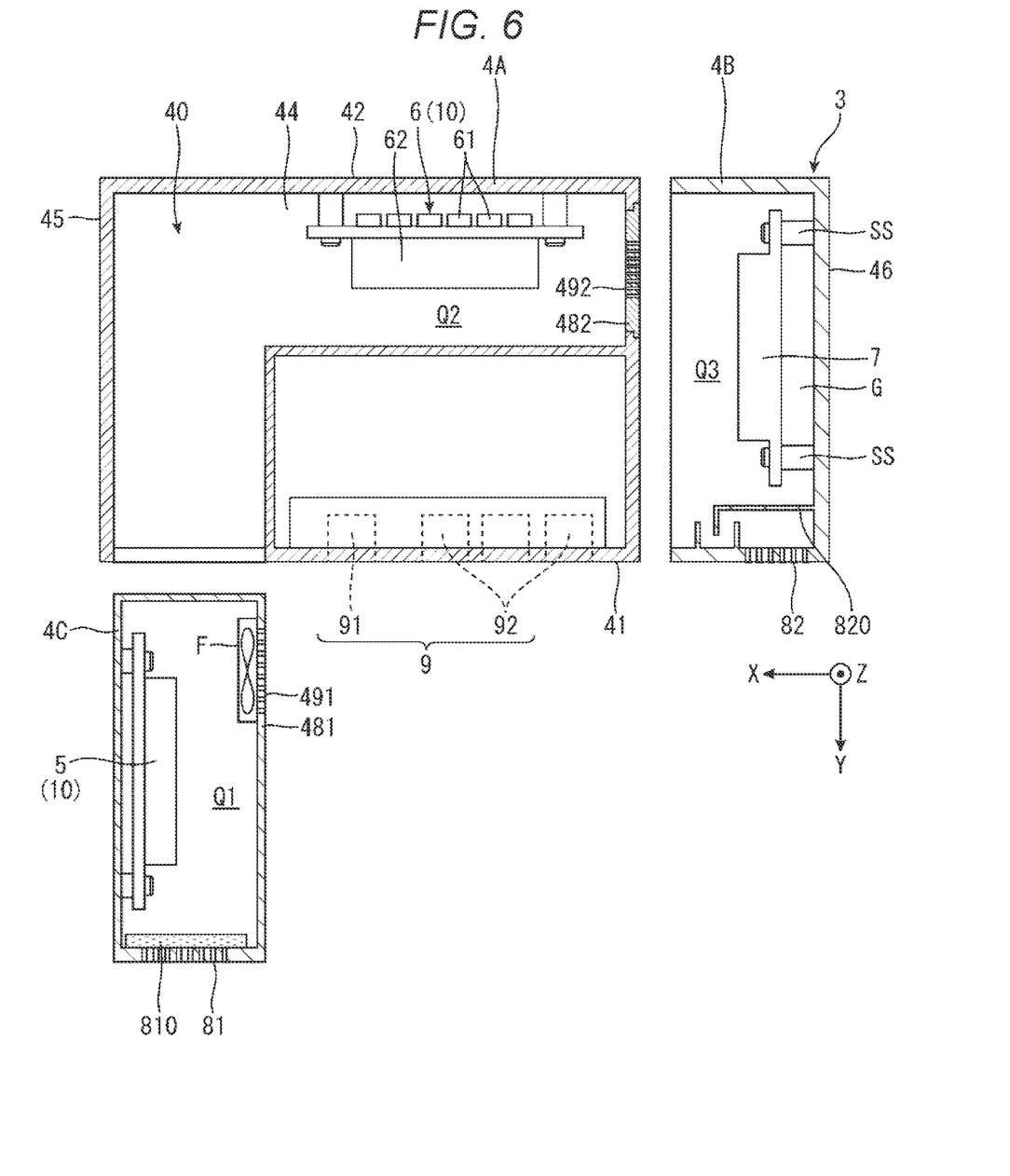
FIG. 6 is a sectional view showing a state in which a cover member is detached from a case main body.
Figure 7:
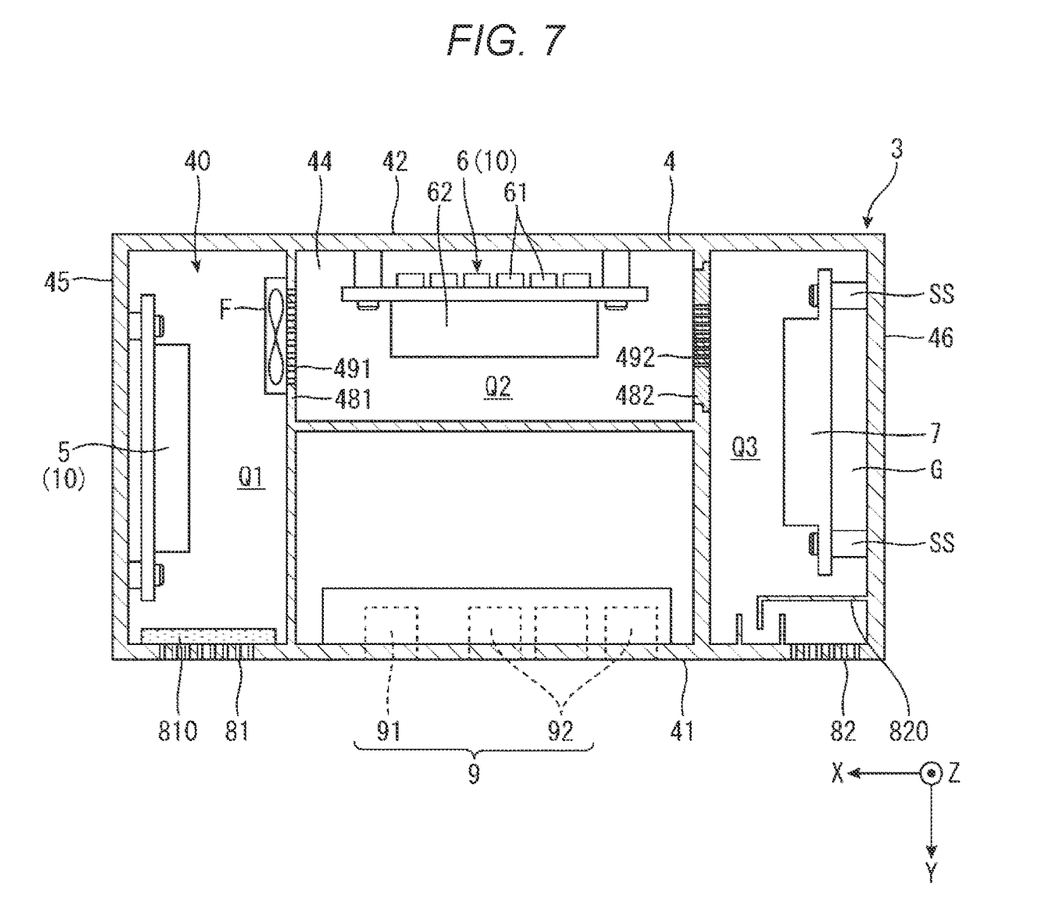
FIG. 7 is a sectional view showing a modified example of the robot controller.

FIG. 1 is an overall configuration diagram of a robot system according to a first embodiment. FIG. 2 is a perspective view showing a robot controller. FIG. 3 is a perspective view showing an example of installation of the robot controller. FIG. 4 is a block diagram of the robot system. FIG. 5 is a sectional view showing an interior of the robot controller. FIG. 6 is a sectional view showing a state in which a cover member is detached from a case main body. FIG. 7 is a sectional view showing a modified example of the robot controller.

In the individual drawings except FIG. 1, as three axes orthogonal to one another, an X-axis, a Y-axis, and a Z-axis are shown. Directions along the X-axis, parallel to the X-axis are also referred to as "X-axis directions", directions along the Y-axis, parallel to the Y-axis are also referred to as "Y-axis directions", and directions along the Z-axis, parallel to the Z-axis are also referred to as "Z-axis directions". Further, head sides of arrows of the individual axes are referred to as "plus sides" and the opposite sides are referred to as "minus sides". The plus side in the Z-axis direction is also referred to as "upper" and the minus side in the Z-axis direction is also referred to as "lower".

A robot system 1 shown in FIG. 1 has a robot 2 and a robot controller 3 controlling driving of the robot 2.

Robot 2

The robot 2 is a robot for work of e.g., feeding, removing, transport, assembly, etc. of precision apparatuses and components forming the precision apparatuses. Note that the use of the robot 2 is not particularly limited. The robot 2 is a six-axis robot having six pivot axes. The robot 2 has a base 21 and a robot arm 22 pivotably coupled to the base 21, and an end effector 23 is attached to the distal end portion of the robot arm 22.

The robot arm 22 is a robotic arm in which a plurality of arms 221, 222, 223, 224, 225, 226 are pivotably coupled and includes six joints J1 to J6. Of the joints, the joints J2, J3, J5 are bending joints and the joints J1, J4, J6 are twisting joints. Further, in each of the joints J1, J2, J3, J4, J5, J6, a motor M and an encoder E are placed.

The end effector 23 is coupled to the arm 226. The end effector 23 is detachable from the arm 226 and one suitable for work to be executed by the robot 2 may be selected and attached.

As above, the robot 2 is explained, however, the configuration of the robot 2 is not particularly limited. For example, the robot 2 may be a scalar robot (horizontal articulated robot), a dual-arm robot, or the like. Further, the robot 2 may be fixed to a floor or the like to be immobile or fixed to a vehicle such as an automated guided vehicle (AGV) to be movable.

Robot Controller 3

The robot controller 3 is held within the base 21. Note that the installation of the robot controller 3 is not particularly limited. For example, the robot controller is not necessarily held in the robot 2.

The robot controller 3 independently controls driving of the respective motors M of the joints J1 to J6. As shown in FIG. 2, the robot controller 3 has a case substantially in a cubic shape and a circuit board 10, a regenerative resistor 7, and a control board 11 held within the case 4. Further, the circuit board 10 has a power supply circuit board 5 and a drive circuit board 6. The power supply circuit board 5 and the drive circuit board 6, i.e., the circuit board 10 are boards converting one of an input alternating current and direct current into the other.

The control board 11 controls motions of the robot 2. The control board 11 sends commands to the drive circuit board 6 as will be described later based on at least the calculated motion position and motion speed of the robot arm 22. The control board 11 includes e.g., a processor such as a CPU (Central Processing Unit), an MPU (Micro Processing Unit), or a DSP (Digital Signal Processor) and an element such as an FPGA (Field-Programmable Gate Array) or an ASIC (Application Specific Integrated Circuit).

As shown in FIG. 4, the power supply circuit board 5 is coupled to an input terminal coupled to a power supply by a power line and the regenerative resistor 7 and the drive circuit board 6 are coupled to the input terminal by a power line in parallel to the power supply circuit board 5. Further, the power supply circuit board 5 and the control board 11 are coupled by a power line and each frame-grounded (FG). A converter circuit (not shown) is provided between the regenerative resistor 7 and a branch point and the converter circuit converts an alternating current input from the power supply via the input terminal into a direct current and supplies the current to the regenerative resistor 7 and the drive circuit board 6.

The case 4 is in the substantially cubic shape having a front surface 41, a back surface 42, an upper surface 43, a lower surface 44, a right side surface 45, and a left side surface 46. The case 4 is formed using e.g., various metal materials including aluminum and stainless steel. Note that the constituent material of the case 4 is not particularly limited to, but includes e.g., various resin materials. Further, on the front surface 41, a connector group 9 including a power supply connector 91 for coupling the robot controller 3 to the power supply and a robot coupling connector 92 for coupling the drive circuit board 6 to the robot 2 is placed. Furthermore, inside of the case 4, internal terminals of the power supply connector 91, the robot coupling connector 92, etc. are placed. The robot controller 3 is electrically coupled to the robot 2 via a cable coupled to the connector group 9. Note that the types and the number of the connectors contained in the connector group 9 are not particularly limited, but may be appropriately set according to the desired specifications.

An intake port 81 sending air into the case 4 and an exhaust port 82 exhausting the air sent into the case 4 from the intake port 81 to the outside are placed in the front surface 41. The intake port 81 is placed in an end portion at the plus side in the X-axis direction of the front surface 41 and the exhaust port 82 is placed in an end portion at the minus side in the X-axis direction of the front surface 41. As described above, it is preferable that the intake port 81 and the exhaust port 82 are placed apart. Thereby, compared to a case where the intake port 81 and the exhaust port 82 are placed adjacent to each other, it may be harder for the intake port 81 to take in the warmed air from the exhaust port 82 and cooling efficiency may be increased.

The above described connector group 9 is placed between these intake port 81 and exhaust port 82. Thereby, a portion between the intake port 81 and the exhaust port 82 of the front surface 41 may be effectively utilized. As described above, the intake port 81, the exhaust port 82, and the connector group 9 are collectively provided in the front surface 41, and thereby, outside of the robot controller 3, a space required for coupling to the connector group 9 and a space provided not to close the intake port 81 and the exhaust port 82 are collectively provided in the front surface 41, restrictions on the position and the placement of the robot controller 3 may be reduced and the degree of freedom of installation is increased.

The robot controller is often installed in a container with higher strength and air-tightness called an enclosure or a cabinet for the purpose of protection from impact, dust, and water. In the container, for strength and air-tightness, e.g., a space S closed at both the left and right sides (both sides in the X-axis direction), both upper and lower sides (both sides in the Z-axis direction), and a rear side (the minus side in the Y-axis direction) as shown in FIG. 3 is provided. Even when installed in the space S, the robot controller 3 may be appropriately placed in an attitude in which coupling to the connector group 9 can be made and both the intake port 81 and the exhaust port 82 are not closed. Particularly, as the installation space of the robot controller 3 is smaller with the downsizing of the robot 2, the increase of the degree of freedom of installation is very important. Note that, not limited to that, but the intake port 81 and the exhaust port 82 may be placed in another surface than the front surface 41 e.g., the upper surface 43. Alternatively, the intake port 81 and the exhaust port 82 may be placed in the other different surfaces from each other than the front surface 41, e.g., the right side surface 45 and the left side surface 46.

Further, as shown in FIG. 5, a flow channel 40 connecting the intake port 81 and the exhaust port 82, in which the air as a gas supplied from the intake port 81 flows toward the exhaust port 82, is formed within the case 4. The flow channel 40 is formed substantially in a U-shape and has one end coupled to the intake port 81 and the other end coupled to the exhaust port 82. For example, the flow channel 40 is formed along the right side surface 45, the back surface 42, and the left side surface 46 of the case 4. Further, the power supply circuit board 5, the drive circuit board 6, and the regenerative resistor 7 are placed within the flow channel 40 and these units are cooled by the air flowing within the flow channel 40. Note that the gas supplied from the intake port 81 is not limited to the air.

The flow channel 40 has an upstream region Q1 extending from the intake port 81 to the minus side in the Y-axis direction, an intermediate region Q2 located downstream of the upstream region Q1 and extending to the minus side in the X-axis direction, and a downstream region Q3 located downstream of the intermediate region Q2 and extending to the plus side in the Y-axis direction. For example, the upstream region Q1 is formed along the right side surface 45 of the case 4, the intermediate region Q2 is formed along the back surface 42 of the case 4, and the downstream region Q3 is formed along the left side surface 46 of the case 4. Of these regions, the upstream region Q1 and the intermediate region Q2 correspond to a first region of the embodiment and the downstream region Q3 corresponds to a second region of the embodiment. The power supply circuit board 5 is placed in the upstream region Q1, the drive circuit board 6 is placed in the intermediate region Q2, and the regenerative resistor 7 is placed in the downstream region Q3. By the placement, the power supply circuit board 5, the drive circuit board 6, and the regenerative resistor 7 may be cooled under the respective appropriate conditions, and reliability the of robot controller 3 may be increased. This will be described later in detail. Note that the internal terminals of the connector group 9 are placed in a region except the flow channel 40 of the case 4, i.e., a region except at least the upstream region Q1, the intermediate region Q2, and the downstream region Q3.

Further, between the upstream region Q1 and the intermediate region Q2, a partition wall 481 partitioning these regions is placed and a communication hole 491 for communication between the upstream region Q1 and the intermediate region Q2 is formed in the partition wall 481. Accordingly, the air flows from the upstream region Q1 to the intermediate region Q2 via the communication hole 491. Similarly, between the intermediate region Q2 and the downstream region Q3, a partition wall 482 partitioning these regions is placed and a communication hole 492 for communication between the intermediate region Q2 and the downstream region Q3 is formed in the partition wall 482. Accordingly, the air flows from the intermediate region Q2 to the downstream region Q3 via the communication hole 492. Each of the communication holes 491, 492 includes a plurality of regularly arranged fine pores. Note that the configurations of the communication holes 491, 492 are respectively not particularly limited.

A filter 810 is placed in the intake port 81. Thereby, entry of foreign matter from the intake port 81 into the flow channel 40 may be suppressed. On the other hand, a labyrinth 820 in which the flow channel 40 intricately meanders is placed in the exhaust port 82. Thereby, entry of foreign matter into the flow channel 40 may be suppressed. Further, the labyrinth 820 is placed, and thereby, contact of a finger entering from the exhaust port 82 with the regenerative resistor 7 within the downstream region Q3 may be effectively suppressed. That is, the labyrinth 820 also functions as a guard to prevent contact between a finger and the regenerative resistor 7. Furthermore, the exhaust port 82 is formed in a slit shape having a width of less than 12 mm for preventing entry of a finger. The regenerative resistor 7 is placed at a distance of 10 mm or more apart from the exhaust port 82. Thereby, IP code IP2x may be acquired. Accordingly, the reliability and the safety of the robot controller 3 are increased. Note that the configuration is not limited to that, but the labyrinth 820 may be omitted.

A fan F is provided in the communication hole 491. The fan F is driven, and thereby, an air flow may be forcibly produced and cooling efficiency of the power supply circuit board 5, the drive circuit board 6, and the regenerative resistor 7 is increased. Particularly, the fan F is provided in the middle of the flow channel 40, and thereby, compared to a case where the fan is provided in the end portion (the intake port 81 or the exhaust port 82) of the flow channel 40, the output of the fan F can be reduced and the number of provided fans F can be reduced. Therefore, power-saving driving and downsizing may be realized. Further, the fan F is placed in the communication hole 491, and thereby, the air passes through the fan F without leakage and the velocity of the air flow may be increased. Note that the placement and the number of the fans F are not particularly limited, but the fan may be placed in the intake port 81 or the exhaust port 82. Alternatively, the fans may be placed in both the intake port 81 and the exhaust port 82.

The above described case 4 has a case main body 4A and two cover members 4B, 4C detachably attached to the case main body 4A. Further, the case main body 4A includes the connector group 9 and the intermediate region Q2, the cover member 4B includes the exhaust port 82 and the downstream region Q3, and the cover member 4C includes the intake port 81 and the upstream region Q1.

The cover member 4B is located at the minus side in the X-axis direction of the case main body 4A and attached to the left side surface of the case main body 4A. Further, the cover member 4B has a box shape opened at the plus side in the X-axis direction. Accordingly, as shown in FIG. 6, when the cover member 4B is detached from the case main body 4A, the regenerative resistor 7 within the downstream region Q3 is exposed from the opening of the cover member 4B. According to the configuration, the regenerative resistor 7 may be detached together with the cover member 4B, and thereby, the regenerative resistor 7 may be replaced without direct contact with the regenerative resistor 7. Therefore, risks of burn, electrical shock, etc. are reduced and the safety of the robot controller 3 is increased. Further, the exhaust port 82 is placed in the cover member 4B, and thereby, the maintenance of the exhaust port 82 is easier.

The cover member 4C has a box shape opened in the upper part and may be put in and out of the case main body 4A from the front surface 41 like a drawer. As shown in FIG. 6, when the cover member 4C is detached from the case main body 4A, the power supply circuit board 5, the fan F, and the filter 810 within the upstream region Q1 are exposed from the opening of the cover member 4C. According to the configuration, the maintenance and the replacement of the power supply circuit board 5, the fan F, and the filter 810 are easier.

Note that the configuration of the case 4 is not particularly limited. For example, as shown in FIG. 7, the cover members 4B, 4C may be omitted. Alternatively, one of the cover members 4B, 4C may be omitted.

Next, the power supply circuit board 5, the drive circuit board 6, and the regenerative resistor 7 placed within the flow channel 40 will be explained.

As shown in FIG. 5, the power supply circuit board 5 is placed in the upstream region Q1. The power supply circuit board 5 converts the input alternating current into the direct current and supplies power to the control board 11. The power supply circuit board 5 is e.g. a switching-type power supply circuit board on which a rectifier bridge rectifying the alternating-current voltage input from the power supply, a primary electrolytic capacitor smoothing the rectified voltage, a switching element converting the smoothed voltage into a high-frequency alternating-current voltage, a high-frequency transformer, a secondary diode rectifying the voltage transmitted via the high-frequency transformer, a secondary electrolytic capacitor smoothing the rectified voltage, a control circuit for controlling driving of the switching element to keep the output voltage constant, etc. are mounted. In the rectifier bridge, the electrolytic capacitor, the switching element, the high-frequency transformer, the secondary diode, the secondary electrolytic capacitor, the control circuit, etc., losses occur in the conversions and heat is generated. The direct-current voltage (DC) generated in the power supply circuit board 5 is supplied to the control circuit 11 as a power supply voltage. Note that the configuration of the power supply circuit board 5 is not particularly limited.

For example, the power supply circuit board 5 is fixed to the right side surface of the cover member 4C by screws. The power supply circuit board 5 is placed on the right side surface of the cover member 4C, and thereby, the power supply circuit board 5 is hard to be located near the communication hole 491 and the air may be smoothly flown from the upstream region Q1 to the intermediate region Q2. Note that the placement of the power supply circuit board 5 is not particularly limited.

As shown in FIG. 5, the drive circuit board 6 is placed in the intermediate region Q2. The drive circuit board 6 converts the input direct current into the alternating current and supplies electric power to the individual motors M and controls driving of the individual motors M. The drive circuit board 6 is a board on which six drive circuits 61 are mounted in correspondence with the six motors contained in the robot arm 22. As shown in FIG. 4, the drive circuit 61 is an inverter circuit and coupled to the control board 11 by a signal line and six switching elements are provided therein. The motor M is a motor driven by a three-phase alternating current, and one drive circuit 61 is coupled to the motor M by three power lines. When the three power lines are e.g., U-phase, V-phase, W-phase, the drive circuit 61 has the two switching elements for U-phase, other two switching elements for V-phase, and the other two switching elements for W-phase. The two switching elements for each phase are series-coupled and the power line for each phase of the motor M is coupled between the two switching elements.

When a current command value for controlling the motor M is output from the control board 11 to the drive circuit 61, the drive circuit 61 operates the switching elements to change the combination of ons and offs and the ratio of ons and offs of the six switching elements in response to the input of the current command value. By the operation of the switching elements, the three-phase alternating current is generated from the direct current. The drive circuit 61 supplies the three-phase alternating current to the motor M as electric power. Note that, in the switching element, losses occur in the conversion and heat is generated. In the illustrated configuration, the six drive circuits 61 are arranged in a row on the back surface of the board and a heat sink 62 is placed on the front surface of the board as a radiation member. The heat sink 62 is placed to overlap with all the drive circuits 61. Thereby, the cooling efficiency is increased. Further, as the drive circuit 61, e.g., an IPM (Intelligent Power Modules) may be used. Note that the configuration of the drive circuit 61 is not particularly limited. For example, the heat sink 62 may be divided and placed with respect to each drive circuit 61.

Further, for example, the drive circuit board 6 is fixed to the back surface 42 by screws. The heat sink 62 is placed to overlap with the fan F as seen from the X-axis directions. Thereby, a turbulent flow produced by the fan F may be efficiently hit on the heat sink 62, and the drive circuit board 6 may be cooled more efficiently. Note that the placement of the drive circuit board 6 is not particularly limited.

As shown in FIG. 5, the regenerative resistor 7 is placed in the downstream region Q3. The regenerative resistor 7 is a resistor converting counter electromotive forces generated from the respective motors M into heat and consumes. Thereby, a control abnormality due to overvoltage may be suppressed. The regenerative resistor 7 of the embodiment is a cement resistor and converts the counter electromotive forces into heat and consumes. Note that, as shown in FIG. 4, the regenerative resistor 7 and the power lines are coupled via the switches and, for example, ons and offs of the switches are controlled by the control board 11.

Further, for example, the regenerative resistor 7 is fixed to the left side surface 46 by screws. As described above, the regenerative resistor 7 is placed on the left side surface 46, and thereby, the regenerative resistor 7 is harder to be located near the communication hole 492 and the air may be smoothly flown from the intermediate region Q2 to the downstream region Q3. The regenerative resistor 7 is placed on the left side surface 46 via a spacer SS and an air gap G is formed between the regenerative resistor 7 and the left side surface 46. Thereby, the contact area of the regenerative resistor 7 with the airflow may be made larger and the cooling efficiency of the regenerative resistor 7 is increased. Further, the heat of the regenerative resistor 7 is harder to be transferred to the case 4 and risks of burn etc. may be reduced. In the viewpoint, it is preferable that the spacer SS is formed using a material having lower thermal conductivity such as a resin material. Note that the placement of the regenerative resistor 7 is not particularly limited.

Furthermore, the regenerative resistor 7 has a case holding the cement resistor and the case is at the same potential as the case 4. Thereby, risks of electrical shock etc. may be reduced.

As above, the power supply circuit board 5, the drive circuit board 6, and the regenerative resistor 7 are explained. In the power supply circuit board 5 and the drive circuit board 6, when one of the input alternating current and direct current is converted into the other, losses occur and heat is generated. Of the heat, the amount of heat generation in the power supply circuit board 5 is not so large. However, the electrolytic capacitor mounted on the power supply circuit board 5 has a property that the life tends to be shorter as the ambient temperature is higher. Generally, it is known that, when the ambient temperature rises by 10° C., the life is lower to about a half. Accordingly, it is preferable to cool the power supply circuit board 5 more strongly. For the purpose, as described above, in the embodiment, the power supply circuit board 5 is placed in the upstream region Q1 and cooled using the fresh air introduced from the intake port 81. Thereby, the power supply circuit board 5 may be cooled with excellent efficiency and property degradation of the power supply circuit board 5 may be suppressed. Particularly, the upstream region Q1 is at negative pressure by driving of the fan F and the velocity of the air flow within the upstream region Q1 is higher, and the air flow collides with the power supply circuit board 5 more swiftly. Accordingly, the power supply circuit board 5 may be cooled more effectively and the above described effects become more remarkable.

The drive circuit board 6 has a larger amount of heat generation than the power supply circuit board 5 because the drive circuits 61 are heat sources. On the other hand, the ambient temperature is less affected on the life than that for the power supply circuit board 5. That is, the drive circuit board 6 is better than the power supply circuit board 5 in heat resistance and has lower priority for cooling than the power supply circuit board 5. Accordingly, as described above, in the embodiment, the drive circuit board 6 is placed in the intermediate region Q2 and the air used for cooling of the power supply circuit board 5 and becoming slightly warm is used for cooling. Also, in this manner, the drive circuit board 6 may be cooled under the sufficient condition and the property degradation of the drive circuit board 6 may be suppressed. Particularly, the fan F is provided in the communication hole 491 and the turbulent flow produced in the fan F collides with the drive circuit board 6. Accordingly, the drive circuit board 6 may be cooled more effectively and the above described effects become more remarkable.

The amount of heat generation of the regenerative resistor 7 is larger than that of the power supply circuit board 5 and smaller than that of the drive circuit board 6. The ambient temperature is little affected on the life. That is, the regenerative resistor 7 is better than the drive circuit board 6 in heat resistance and has lower priority for cooling than the drive circuit board 6. Accordingly, as described above, in the embodiment, the regenerative resistor 7 is placed in the downstream region Q3 and the air used for cooling of the drive circuit board 6 and becoming warmer is used for cooling. Also, in this manner, the regenerative resistor 7 may be cooled under the sufficient condition and the property degradation of the regenerative resistor 7 may be suppressed. Particularly, in the embodiment, the opening area of the communication hole 492 is smaller than the opening areas of the intake port 81 and the communication hole 491. Accordingly, the velocity of the air flow is higher while passing through the communication hole 492 and the air flow collides with the regenerative resistor 7 more swiftly. Therefore, the regenerative resistor 7 may be cooled more effectively and the above described effects become more remarkable.

As above, the robot system 1 of the embodiment is explained. As described above, the robot controller 3 of the robot system 1 includes the case 4 having the intake port 81 and the exhaust port 82 and the flow channel 40 connecting the intake port 81 and the exhaust port 82, in which the air as the gas supplied from the intake port 81 flows toward the exhaust port 82, and the circuit board 10 converting one of the alternating current and the direct current into the other. Further, the flow channel 40 has the upstream region Q1 and the intermediate region Q2 as the first region in which the circuit board 10 is placed, the downstream region Q3 as the second region located downstream of the intermediate region Q2, the partition wall 482 partitioning the intermediate region Q2 and the downstream region Q3, and the communication hole 492 formed in the partition wall 482 and communicating between the intermediate region Q2 and the downstream region Q3. Further, the opening area of the communication hole 492 is smaller than the opening area of the intake port 81. According to the configuration, the circuit board 10 may be efficiently cooled. Further, the velocity of the air flow is higher while passing through the communication hole 492 and the components placed in the downstream region Q3 may be effectively cooled. Therefore, the respective units within the flow channel 40 may be cooled under the suitable conditions, and the robot controller 3 with higher reliability may be obtained.

As described above, the intake port 81 and the exhaust port 82 are placed in the front surface 41, i.e., the same surface. Thereby, the degree of freedom of installation of the robot controller 3 is increased.

As described above, the robot controller 3 has the robot coupling connector 92 as the connector placed in the front surface 41 and coupled to the robot 2. Thereby, the degree of freedom of installation of the robot controller 3 is increased.

As described above, the robot controller 3 has the regenerative resistor 7 placed in the downstream region Q3 and consuming the counter electromotive forces generated from the motors M. Thereby, a control abnormality due to overvoltage may be suppressed.

As described above, the robot controller includes the control board 11 for controlling the motion of the robot 2, and the circuit board 10 has the drive circuit board 6 for controlling driving of the motors M and the power supply circuit board 5 for supplying the electric power to the control board 11. Further, the power supply circuit board 5 is placed upstream of the drive circuit board 6. The power supply circuit board 5 is more likely to be affected by heat than the drive circuit board 6 and the power supply circuit board 5 is placed upstream of the drive circuit board 6 and preferentially cooled, and thereby, the power supply circuit board 5 and the drive circuit board 6 may be cooled under the respective suitable conditions. As a result, the robot controller 3 with higher reliability may be obtained.

As described above, the robot controller 3 has the fan F placed between the power supply circuit board 5 and the drive circuit board 6 within the flow channel 40. Thereby, compared to a case where the fan is provided in the end portion (the intake port 81 or the exhaust port 82) of the flow channel 40, the output of the fan F can be reduced and the number of placed fans F can be reduced. Therefore, power-saving driving and downsizing may be realized. Further, the drive circuit board 6 may be effectively cooled by the turbulent flow produced in the fan F.

As described above, the robot system 1 includes the robot 2 having the motors M and the robot controller 3 coupled to the robot 2 and controlling the driving of the motors M. Further, the robot controller 3 includes the case 4 having the intake port 81 and the exhaust port 82 and the flow channel 40 connecting the intake port 81 and the exhaust port 82, in which the air as the gas supplied from the intake port 81 flows toward the exhaust port 82, and the circuit board 10 converting one of the alternating current and the direct current into the other. Further, the flow channel 40 has the upstream region Q1 and the intermediate region Q2 as the first region in which the circuit board 10 is placed, the downstream region Q3 as the second region located downstream of the intermediate region Q2, the partition wall 482 partitioning the intermediate region Q2 and the downstream region Q3, and the communication hole 492 formed in the partition wall 482 and communicating between the intermediate region Q2 and the downstream region Q3. Further, the opening area of the communication hole 492 is smaller than the opening area of the intake port 81. According to the configuration, the circuit board 10 may be efficiently cooled. Further, the velocity of the air flow is higher while passing through the communication hole 492 and the components placed in the downstream region Q3 may be effectively cooled. Therefore, the respective units within the flow channel 40 may be cooled under the suitable conditions, and the robot system 1 with higher reliability may be obtained.

Second Embodiment

Figure 8:
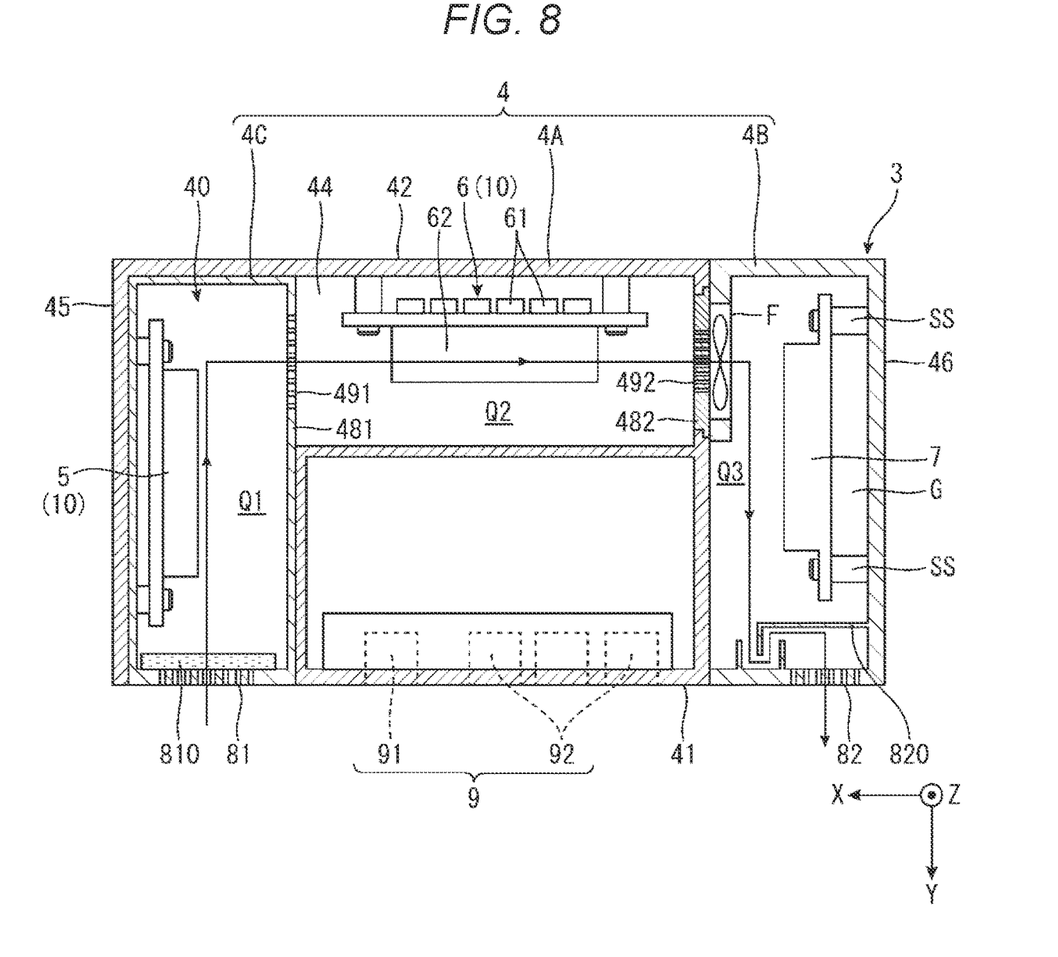
FIG. 8 is a sectional view showing an interior of a robot controller according to a second embodiment.
Figure 9:
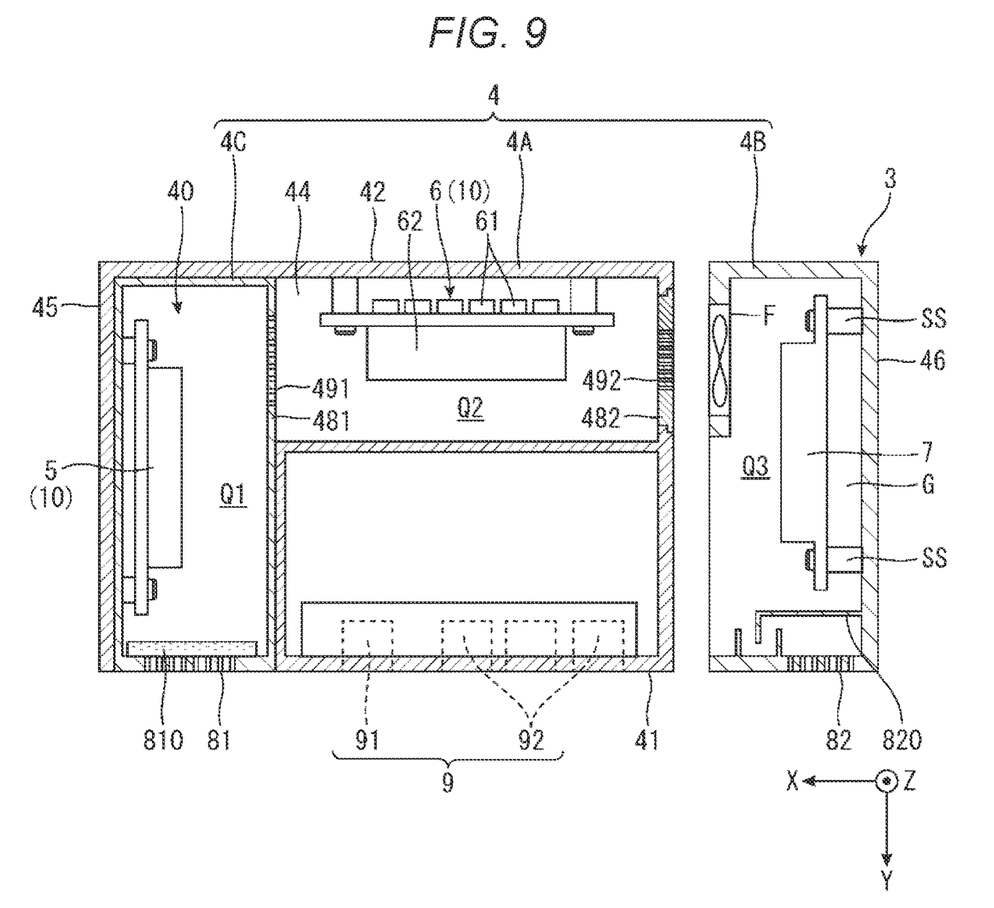
FIG. 9 is a sectional view showing a state in which the cover member is detached from the case main body.

FIG. 8 is a sectional view showing an interior of a robot controller according to a second embodiment. FIG. 9 is a sectional view showing a state in which the cover member is detached from the case main body.

The robot controller 3 of the embodiment is the same as the robot controller 3 of the first embodiment except that the placement of the fan F is different. Accordingly, in the following description, the embodiment will be explained with a focus on the differences from the above described first embodiment and the explanation of the same items will be omitted. Further, in the individual drawings in the embodiment, the same configurations as those of the above described embodiment have the same signs.

As shown in FIG. 8, in the robot controller 3 of the embodiment, the fan F is placed in the communication hole 92. Thereby, compared to a case where the fan is provided in the end portion (the intake port 81 or the exhaust port 82) of the flow channel 40, the output of the fan F can be reduced and the number of provided fans F can be reduced. Therefore, power-saving driving and downsizing may be realized. Further, the fan F is placed in the communication hole 492, and thereby, the air passes through the fan F without leakage and the velocity of the air flow may be increased. Furthermore, the turbulent flow may be produced by the fan F. Therefore, the regenerative resistor 7 within the downstream region Q3 may be effectively cooled.

As shown in FIG. 9, the fan F is fixed to the cover member 4B and detachable together with the cover member 4B. Therefore, the maintenance of the fan F is easier.

As described above, the robot controller 3 of the embodiment has the fan F placed in the communication hole 492. Thereby, the components within the downstream region Q3 may be effectively cooled.

According to the second embodiment, the same effects as those of the above described first embodiment may be exerted.

Third Embodiment

Figure 10:
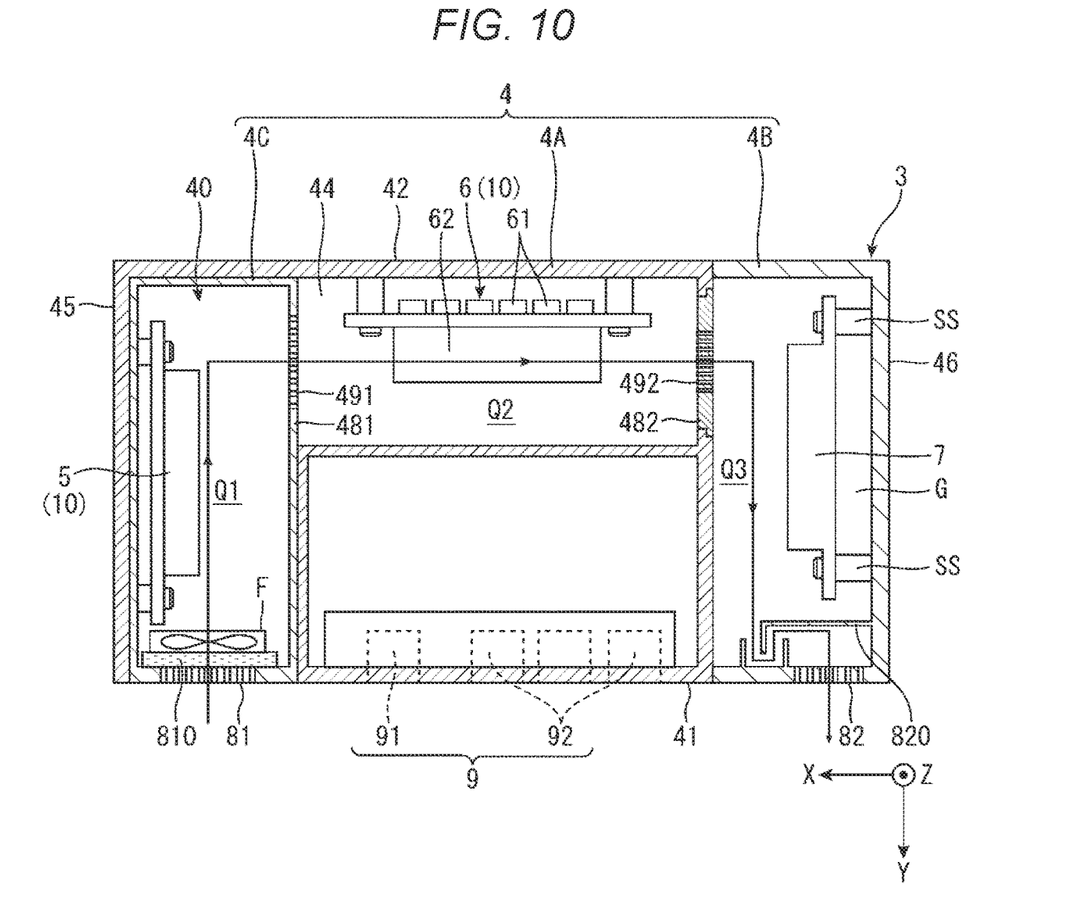
FIG. 10 is a sectional view showing an interior of a robot controller according to a third embodiment.

FIG. 10 is a sectional view showing an interior of a robot controller according to a third embodiment.

The robot controller 3 of the embodiment is the same as the robot controller 3 of the above described first embodiment except that the placement of the fan F is different. Accordingly, in the following description, the embodiment will be explained with a focus on the differences from the above described first embodiment and the explanation of the same items will be omitted. Further, in the drawings in the embodiment, the same configurations as those of the above described embodiment have the same signs.

As shown in FIG. 10, in the robot controller 3 of the embodiment, the fan F is placed in the intake port 81.

According to the third embodiment, the same effects as those of the above described first embodiment may be exerted.

As above, the robot controller and the robot system according to the present disclosure are explained based on the illustrated embodiments, however, the present disclosure is not limited to those. The configurations of the respective units may be replaced by any configurations having the same functions. Further, any other configuration may be added to the present disclosure.

What is claimed is:

1. A robot controller comprising:
a case having an intake port and an exhaust port and a flow channel connecting the intake port and the exhaust port, a gas supplied from the intake port flowing toward the exhaust port along the flow channel;
a regenerative resistor configured to convert a counter electromotive force generated by a motor of a robot into heat; and
at least one circuit board converting one of an alternating current and a direct current into another, wherein
the flow channel has a first region in which the at least one circuit board is placed, a second region located at a downstream side of the first region along the flow channel, a partition wall partitioning the first region and the second region, and a communication hole formed in the partition wall and communicating between the first region and the second region,
the regenerative resistor is located in the second region and directly faces the communication hole, and
an opening area of the communication hole is smaller than an opening area of the intake port.

2. The robot controller according to claim 1, wherein the intake port and the exhaust port are placed in a same surface.

3. The robot controller according to claim 2, further comprising a connector placed in the same surface and coupled to the robot.

4. The robot controller according to claim 1, further comprising a fan placed adjacent to the communication hole.

5. The robot controller according to claim 1, further comprising a control board for controlling a motion of the robot, wherein
the at least one circuit board has a drive circuit board for controlling driving of the motor and a power supply circuit board for supplying electric power to the control board, and
the power supply circuit board is placed at an upstream side of the drive circuit board.

6. The robot controller according to claim 5, further comprising a fan placed between the power supply circuit board and the drive circuit board along the flow channel.

7. A robot system comprising:
a robot having a motor; and
a robot controller coupled to the robot and controlling driving of the motor, wherein
the robot controller includes:
a case having an intake port and an exhaust port and a flow channel connecting the intake port and the exhaust port, a gas supplied from the intake port-flowing toward the exhaust port along the flow channel;
a regenerative resistor configured to convert a counter electromotive force generated by the motor of the robot into heat;
at least one circuit board converting one of an alternating current and a direct current into another,
the flow channel has a first region in which the at least one circuit board is placed, a second region located at a downstream side of the first region along the flow channel,
a partition wall partitioning the first region and the second region, and a communication hole formed in the partition wall and communicating between the first region and the second region, the regenerative resistor is located in the second region and directly faces the communication hole, and
an opening area of the communication hole is smaller than an opening area of the intake port.

* * * * *